US011081361B2

(12) United States Patent
Kim et al.

(10) Patent No.: US 11,081,361 B2
(45) Date of Patent: Aug. 3, 2021

(54) PLASMA ETCHING METHOD

(71) Applicant: AJOU UNIVERSITY INDUSTRY-ACADEMIC COOPERATION FOUNDATION, Suwon-si (KR)

(72) Inventors: Chang-Koo Kim, Seoul (KR); Jun-Hyun Kim, Seongnam-si (KR); Jin-Su Park, Suwon-si (KR)

(73) Assignee: AJOU UNIVERSITY INDUSTRY-ACADEMIC COOPERATION FOUNDATION, Suwon-si (KR)

( * ) Notice: Subject to any disclaimer, the term of this patent is extended or adjusted under 35 U.S.C. 154(b) by 0 days.

(21) Appl. No.: 16/521,701

(22) Filed: Jul. 25, 2019

(65) Prior Publication Data

US 2020/0035502 A1 Jan. 30, 2020

(30) Foreign Application Priority Data

Jul. 25, 2018 (KR) .......................... 10-2018-0086632

(51) Int. Cl.
*H01L 21/311* (2006.01)
*C09K 13/08* (2006.01)

(52) U.S. Cl.
CPC ........ *H01L 21/31116* (2013.01); *C09K 13/08* (2013.01)

(58) Field of Classification Search
CPC ... H01L 21/31116; C09K 13/08; C09K 13/00; Y02C 20/30
See application file for complete search history.

(56) References Cited

U.S. PATENT DOCUMENTS

| | | | | |
|---|---|---|---|---|
| 6,239,011 B1* | 5/2001 | Chen | ................ | H01L 21/02063 257/E21.252 |
| 6,242,359 B1* | 6/2001 | Misra | ................ | C23C 16/4405 252/79.3 |
| 2005/0091874 A1* | 5/2005 | Chen | ................ | H01L 21/02063 34/445 |
| 2019/0375158 A1* | 12/2019 | Crabtree | ................ | B29C 64/35 |

FOREIGN PATENT DOCUMENTS

| | | |
|---|---|---|
| JP | 2003-297807 A | 10/2003 |
| JP | 2008-53507 A | 3/2008 |

OTHER PUBLICATIONS

By S. Wolf and R.N. Tauber, (Silicon Processing for the VLSI Era, vol. 1—Process Technology, Lattice Press, 1986) (pp. 551-553) (Year: 1986).*

* cited by examiner

*Primary Examiner* — Nadine G Norton
*Assistant Examiner* — Mahmoud Dahimene
(74) *Attorney, Agent, or Firm* — Sughrue Mion, PLLC

(57) ABSTRACT

Provided is a plasma etching method comprising supplying both hexafluoroisopropanol (HFIP) gas and argon (Ar) gas to a plasma chamber receiving an etching target therein, thereby to plasma-etch the etching target.

3 Claims, 8 Drawing Sheets

Unit: nm 200 nm hole pattern mask    100 nm hole pattern mask

Unit: nm

PLASMA ETCHING METHOD

CROSS-REFERENCE TO RELATED APPLICATION

This application claims a benefit under 35 U.S.C. § 119(a) of Korean Patent Application No. 10-2018-0086632 filed on Jul. 25, 2018, on the Korean Intellectual Property Office, the entire disclosure of which is incorporated herein by reference for all purposes.

BACKGROUND

1. Field

The present disclosure relates to a plasma etching method using an etchant with a low global warming potential.

2. Description of Related Art

Perfluorocarbon (PFC) is one of six major greenhouse inducing gases $CO_2$, $CH_4$, $N_2O$, HFC, PFC and $SF_6$. Typical PFC gases include $CF_4$, $C_2F_6$, $C_3F_6$, $C_3F_8$ and $C_4F_8$. The PFC gas is used in various industrial fields. In most semiconductor device manufacturing processes, thin films or structures made of silicon oxide $SiO_2$ or silicon nitride $Si_3N_4$ are etched by a plasma etching method using PFC gas. Typical examples of such processes include via hole, contact hole, and self-align contact etching processes.

However, the PFC gas is chemically stable and has a long average lifetime in the atmosphere and thus a high global warming potential (GWP) value which is 6500 times or greater higher than GWP of $CO_2$. Thus, the small amount of the PFC gas may greatly contribute to the global warming effect. In addition, as a degree of integration of semiconductor devices increases, and thus the miniaturization of the structure is accelerated, the etching process has become more important, and thus the annual emission amount of the PFC gas is continuously increasing. Thus, in order to reduce the emission of PFC gas, various methods such as PFC gas decomposition, separation and collection have been employed. However, those methods have fundamental limits due to the PFC gas having the high GWP.

Further, in the plasma etching using the PFC gas, a fluorocarbon thin film is formed on a $SiO_2$ or $Si_3N_4$ surface due to $CF_x$ radicals. These fluorocarbon thin films act as a source of an etchant during etching and also interfere with diffusion of reactive ions and radicals, and protect a wall of the etch profile to define a shape thereof. However, excessive formation of such fluorocarbon thin films in the etching process of the hole pattern structure such as via or contact holes causes phenomena such as etching stop. This causes a problem that it is difficult to manufacture a high aspect ratio structure.

Therefore, there is a need for a novel etchant which may replace the conventional PFC gas, have a low GWP and thus are environmentally friendly, have an excellent etching characteristic to allow a high aspect ratio etched structure to be formed, and a need for a plasma etching method using the novel etchant.

SUMMARY

This Summary is provided to introduce a selection of concepts in a simplified form that are further described below in the Detailed Description. This Summary is not intended to identify all key features or essential features of the claimed subject matter, nor is it intended to be used alone as an aid in determining the scope of the claimed subject matter.

One purpose of the present disclosure is to provide a novel etchant which may replace the conventional PFC gas, have a low GWP and thus are environmentally friendly, have an excellent etching characteristic to allow a high aspect ratio etched structure to be formed, and is to provide a plasma etching method using the novel etchant.

In one aspect of the present disclosure, there is provided a plasma etching method comprising supplying both hexafluoroisopropanol (HFIP) gas and argon (Ar) gas to a plasma chamber receiving an etching target therein, thereby to plasma-etch the etching target.

In one implementation, the hexafluoroisopropanol gas and the argon gas are supplied at a flow rate ratio in a range of 1:1 to 1:9.

In one implementation, the hexafluoroisopropanol gas and the argon gas are supplied at a flow rate ratio in a range of 1:1.5 to 1:4.

In one implementation, the hexafluoroisopropanol gas and the argon gas are supplied at a flow rate ratio of 1:2.

In one implementation, the etching target includes at least one of oxide of silicon and nitride of silicon.

In one implementation, the etching target includes at least one of oxide of silicon and nitride of silicon, wherein a hole pattern mask is disposed on the etching target, wherein the plasma etching allows the etching target to have a high aspect ratio etched structure.

According to the plasma etching method according to the present disclosure, the etching target can be plasma-etched with excellent etching characteristics using a combination of hexafluoroisopropanol (HFIP) and argon gases with a very low global warming potential (GWP) of 190. According to the present disclosure, the plasma etching method can exhibit an etching characteristic that is at least four times higher than that of a plasma etching method using the conventional PFC gas having a high GWP at the same condition and thus can etch the etching target in an environmentally friendly manner. Thus, the present plasma etching method using the combination of hexafluoroisopropanol (HFIP) and argon gases may replace the plasma etching method using the conventional PFC gas.

Further, using the etching method according to the present disclosure may provide for a high aspect ratio etched hole structure. Accordingly, the plasma etching method according to the present disclosure may be applied to a plasma etching process in various technical fields such as a semiconductor or a display using the conventional PFC gas such that environmentally friendly etching may be performed with excellent characteristics.

BRIEF DESCRIPTION OF THE DRAWINGS

The accompanying drawings, which are incorporated in and form a part of this specification and in which like numerals depict like elements, illustrate embodiments of the present disclosure and, together with the description, serve to explain the principles of the disclosure.

DETAILED DESCRIPTIONS

Figure 1:
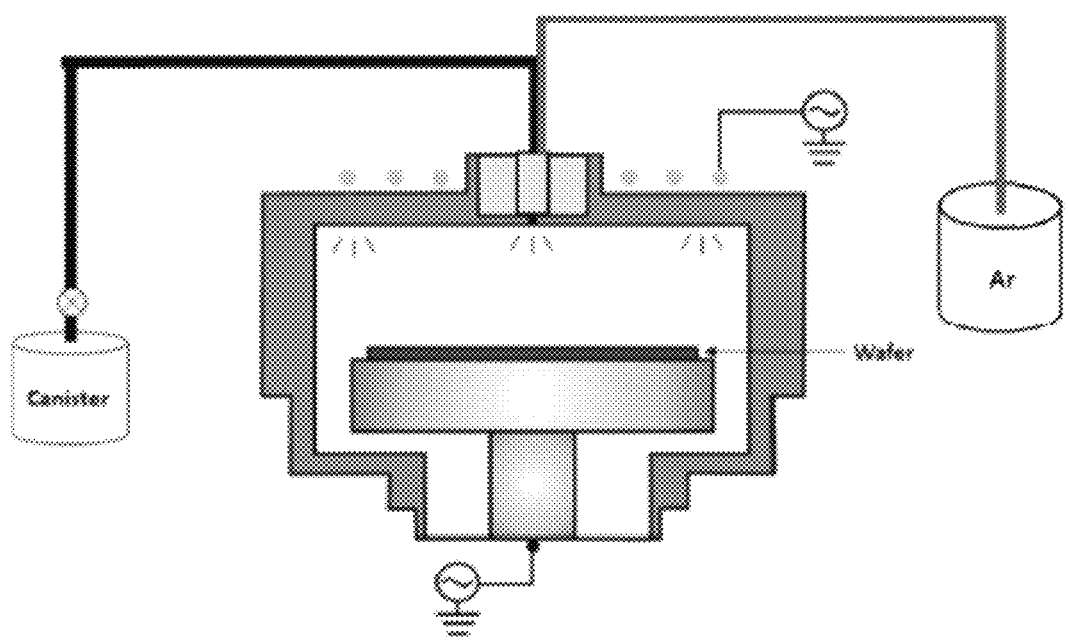
FIG. 1 shows a schematic diagram of a plasma etching apparatus to illustrate a plasma etching method according to one embodiment of the present disclosure.

For simplicity and clarity of illustration, elements in the figures are not necessarily drawn to scale. The same reference numbers in different figures denote the same or similar elements, and as such perform similar functionality. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

Examples of various embodiments are illustrated and described further below. It will be understood that the description herein is not intended to limit the claims to the specific embodiments described. On the contrary, it is intended to cover alternatives, modifications, and equivalents as may be included within the spirit and scope of the present disclosure as defined by the appended claims.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises", "comprising", "includes", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements may modify the entire list of elements and may not modify the individual elements of the list.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In the following description, numerous specific details are set forth in order to provide a thorough understanding of the present disclosure. The present disclosure may be practiced without some or all of these specific details. In other instances, well-known process structures and/or processes have not been described in detail in order not to unnecessarily obscure the present disclosure.

A plasma etching method according to the present disclosure includes supplying hexafluoroisopropanol (HFIP) gas and argon (Ar) gas into a plasma chamber where an etching target is disposed, thereby plasma-etching the etching target.

In this connection, to provide the HFIP gas to the plasma chamber, first, a vessel containing the HFIP and a chamber connection line connecting the vessel containing the HFIP and the plasma chamber may be heated.

FIG. 1 shows a schematic diagram of a plasma etching apparatus to illustrate the plasma etching method according to one embodiment of the present disclosure.

As shown in FIG. 1, the HFIP has a boiling point of 58° C. Thus, the HFIP is present in a liquid phase at room temperature. For this reason, the HFIP is vaporized to uniformly introduce the gas-phase HFIP into the plasma chamber. The vaporization of HFIP according to the present disclosure may be performed by heating the chamber connection line connecting a canister to the plasma etching chamber and heating the canister to accommodate the liquid-phase HFIP therein. In this connection, the canister is heated to a temperature above the boiling point of the HFIP to vaporize the liquid-phase HFIP. It may be desirable to heat the chamber connection line to a higher temperature than the canister heating temperature so that the flow rate does not vary due to the droplet splash in the plasma chamber. In one example, the canister may be heated to 75° C. while the chamber connection line may be heated to 135° C. In this connection, the canister may be heated using a heating jacket. The vaporized HFIP, that is, the HFIP gas may be injected into the plasma chamber. In this connection, a mass flow controller may be installed just before the plasma chamber to provide a steady flow rate of the vaporized HFIP.

According to the present disclosure, the Ar gas is provided into the plasma chamber together with the vaporized HFIP gas. In this connection, the Ar gas is injected into the chamber through a separate Ar gas injection line connected to the plasma chamber in a separate manner from the HFIP gas. According to the present disclosure, the plasma density may be increased in the plasma etching process by injecting the Ar gas together with the HFIP gas into the chamber. Thus, ion bombardment may be used to form an anisotropic etched structure. Specifically, when electropositive Ar is added to an electronegative fluorocarbon plasma, the plasma density is increased, such that the decomposition of precursors such as HFIP is increased. This has a great influence on the gas phase and surface chemistry. For example, a typical variation of the surface chemistry due to the Ar addition is a decrease in the fluorine content of the steady state fluorocarbon formed on the surface. Further, since Ar is positively charged, the Ar accelerates to a wafer having a negative charge to cause ion bombardments. Accordingly, it is possible to form an anisotropic etched structure in a pattern structure such as a hole pattern.

In this connection, the HFIP gas and Ar gas may be fed into the plasma chamber at a flow rate ratio of 1:1 to 1:9. In one example, the flow rate ratio of the HFIP gas and Ar gas may be in a range of 1:1.5 to 1:4, and more preferably, the flow rate ratio of the HFIP gas and Ar gas may be 1:2.

The etching target according to the present disclosure may be a material that can be etched according to the etching method according to the present disclosure and may be at least one of oxide and nitride of silicon. In one example, the etching target according to the present disclosure may be silicon dioxide, silicon nitride, silicon oxynitride, and the like.

According to the present disclosure, the semiconductor manufacturing process using the HFIP and Ar having a significantly lower global warming potential (GWP) of 190 than that of the PFC gas may reduce greenhouse gas emission compared to the semiconductor manufacturing process using the existing PFC gas and may be environment-friendly and may perform the plasma etching with excellent etching characteristic. In particular, the plasma etching process according to the present disclosure can exhibit an etching characteristic that is up to four times higher than that of the plasma etching using the conventional PFC gas $C_4F_8$. A more specific example thereof will be described below with reference to an embodiment of the present disclosure.

Further, in one example, when the etching target on which a hole patterned mask is disposed is subjected to the plasma etching under the HFIP gas and Ar gas, the etched structure with a high aspect ratio may be manufactured. A more specific example thereof will be described below with reference to an embodiment according to the present disclosure.

Hereinafter, a plasma etching method according to the present disclosure will be described with reference to a more specific embodiment.

To perform the plasma-etch according to one embodiment of the present disclosure, first, a canister containing a liquid-phase HFIP is heated to 75° C. to prepare an HFIP gas. Then, the chamber connection line connecting the canister and the plasma chamber to each other is heated to 135° C. In this way, the HFIP gas is prepared.

Then, to check the etching rate according to the Ar flow rate, the HFIP gas and Ar gas are supplied to the plasma chamber while varying the Ar flow rate. Thus, the $SiO_2$ thin film is plasma-etched. In this connection, a total flow rate of the HFIP and Ar gases is controlled to be 30 sccm. The specific plasma etching process conditions are shown in Table 1, and the etching rate according to the Ar flow rate is shown in FIG. 2.

TABLE 1

| Source power (W) | Bias voltage (V) | Discharge Gas | Total Flow Rate (sccm) | Pressure (mTorr) | Substrate Temperature (° C.) |
|---|---|---|---|---|---|
| 250 | −600 | HFIP/Ar | 30 | 10 | 15 |

Figure 2:
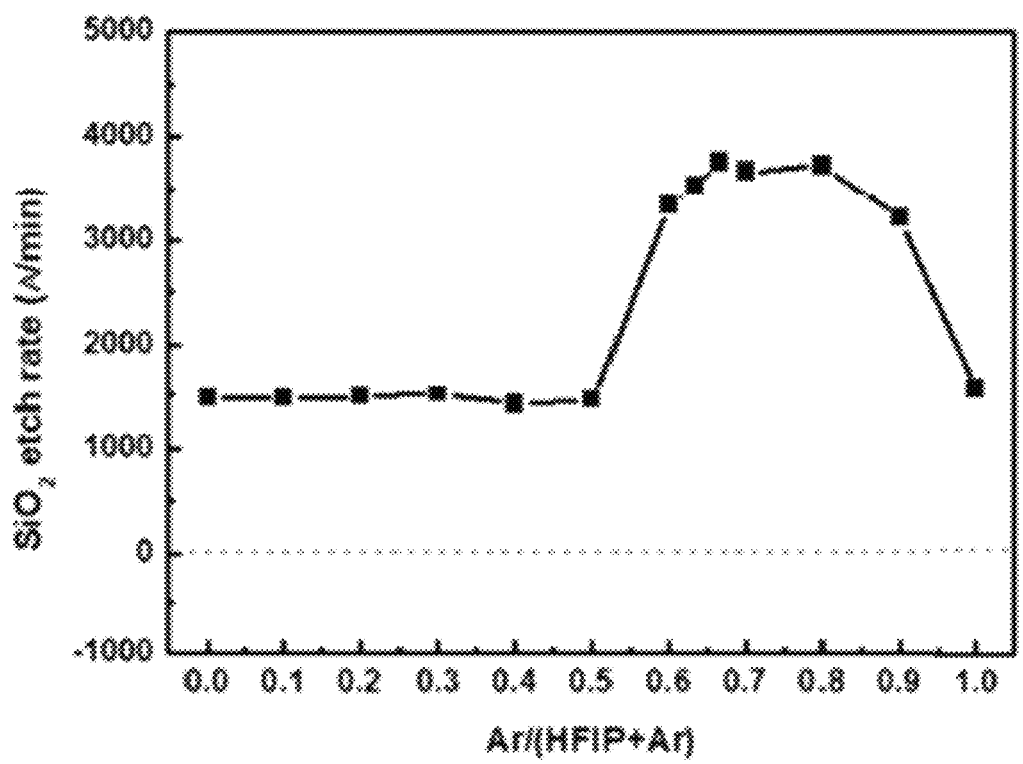
FIG. 2 shows an etching rate variation of a $SiO_2$ thin film based on an Ar flow rate.

FIG. 2 is a diagram for illustrating an etching rate variation of a $SiO_2$ thin film according to an Ar flow rate.

As shown in FIG. 2, when the HFIP based plasma is solely used without Ar, $SiO_2$ is etched at an etching rate of about 1500 Å/min. When the Ar flow rate is lower than 50% of the total flow rate, the similar etching rate is achieved. The etching rate begins to increase when the Ar flow rate is higher than 50% of the total flow rate. Further, it may be seen that when the Ar flow rate is in a range of 67 to 80% of the total flow rate, this exhibits a $SiO_2$ etching rate up to 3750 Å/min. When the Ar flow rate exceeds 80% of the total flow rate, the etching rate decreases. This may be due to the decrease in the amount of etchant HFIP that can etch the $SiO_2$ while the flow rate of the HFIP decreases.

That is, according to the present disclosure, it may be confirmed that the etching target can be etched at an excellent etching rate by supplying the HFIP gas and Ar gas to the plasma chamber at a flow rate in a range of 1:1 to 1:9. In particular, it may be confirmed that etching target can be etched with excellent etching characteristics by injecting the HFIP gas and Ar gas at a flow rate of 1:2.

Then, the Ar flow rate is controlled to be 67% of the total flow rate. Then, the $SiO_2$ etching rate by the HFIP/Ar based plasma according to the present disclosure and the $SiO_2$ etching rate by the $C_4F_8$/Ar based plasma using the PFC gas are compared to each other.

First, in order to compare the $SiO_2$ etching rates by the HFIP/Ar based plasma and $C_4F_8$/Ar based plasma based on the source power, the specific $SiO_2$ etching conditions based on the source disclosure by the HFIP/Ar based plasma according to the present disclosure and $C_4F_8$/Ar based plasma using the PFC gas are shown in Table 2 below. The variation of the SiO2 etching rate is shown in FIG. 3.

TABLE 2

| Source power (W) | Bias voltage (V) | Discharge Gas | Total Flow Rate (sccm) | Pressure (mTorr) | Substrate Temperature (° C.) |
|---|---|---|---|---|---|
| 200 to 500 | −600 | HFIP/Ar $C_4F_8$/Ar | 30 (X/Y = 10/20) | 10 | 15 |

Figure 3:
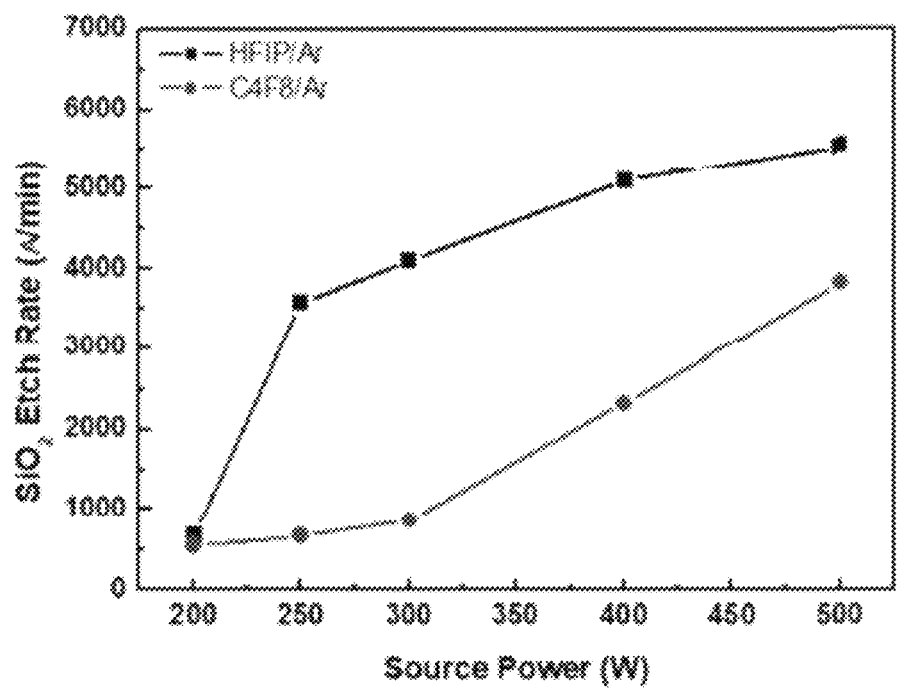
FIG. 3 shows an etching rate variation of a $SiO_2$ thin film based on a source power.

FIG. 3 shows the variation of the $SiO_2$ etching rate according to the source power.

As shown in FIG. 3, the $SiO_2$ etching rate by HFIP/Ar based plasma according to the present disclosure is higher than that by the $C_4F_8$/Ar based plasma under all of the source power conditions.

Then, the $SiO_2$ etching rates by the HFIP/Ar based plasma and by the $C_4F_8$/Ar based plasma are compared to each other based on the bias voltages. The specific $SiO_2$ etching conditions based on the bias voltages under the HFIP/Ar based plasma according to the present disclosure and the $C_4F_8$/Ar based plasma using the PFC gas are shown in Table 3 below. The variation in the $SiO_2$ etching rate is shown in FIG. 4.

TABLE 3

| Source power (W) | Bias voltage (V) | Discharge Gas (X/Y) | Total Flow Rate (sccm) | Pressure (mTorr) | Substrate Temperature (° C.) |
|---|---|---|---|---|---|
| 250 | −400 to −1200 | HFIP/Ar $C_4F_8$/Ar | 30 (X/Y = 10/20) | 10 | 15 |

Figure 4:
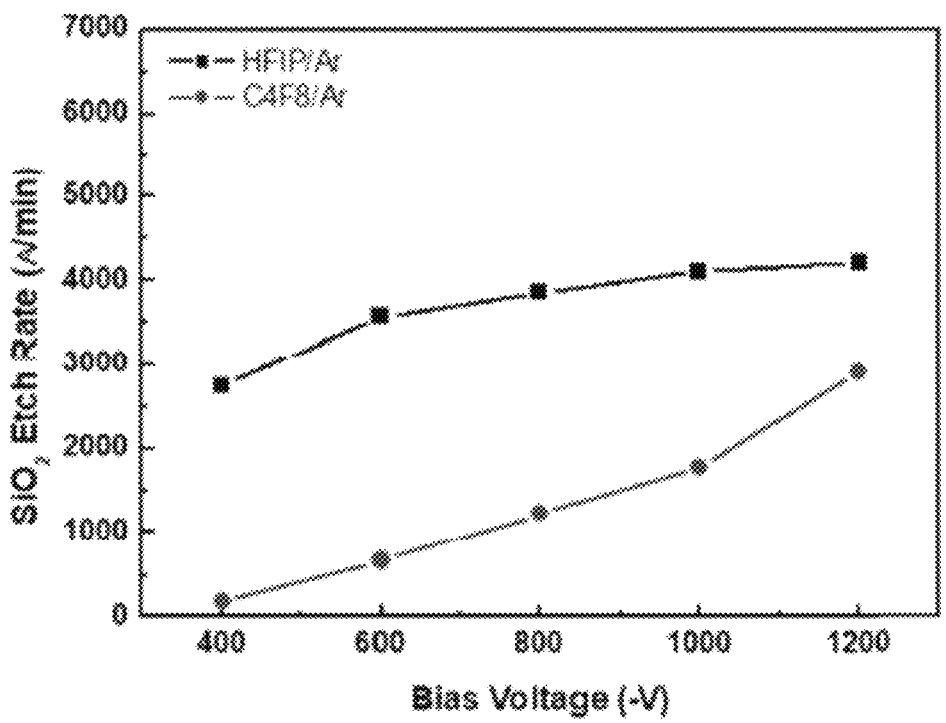
FIG. 4 shows an etching rate variation of a $SiO_2$ thin film based on a bias voltage.

FIG. 4 shows the variation of $SiO_2$ etching rate according to the bias voltage.

Referring to FIG. 4, it may be seen that the $SiO_2$ etching rate by the HFIP/Ar based plasma according to the present disclosure is larger than that by the $C_4F8$/Ar based plasma under all bias voltage conditions.

Further, referring to FIG. 4 with FIG. 3, the HFIP/Ar based plasma according to the present disclosure under the same source power and bias voltage conditions shows a better SiO2 etching rate than that by the $C_4F_8$/Ar based plasma using the PFC gas under the same source power and bias voltage conditions. Specifically, optical emission spectroscopy (OES) is performed to compare the $C_4F_8$/Ar based plasma using the PFC gas with the HFIP/Ar based plasma according to the present disclosure. The comparison results are shown in FIG. 5.

Figure 5:
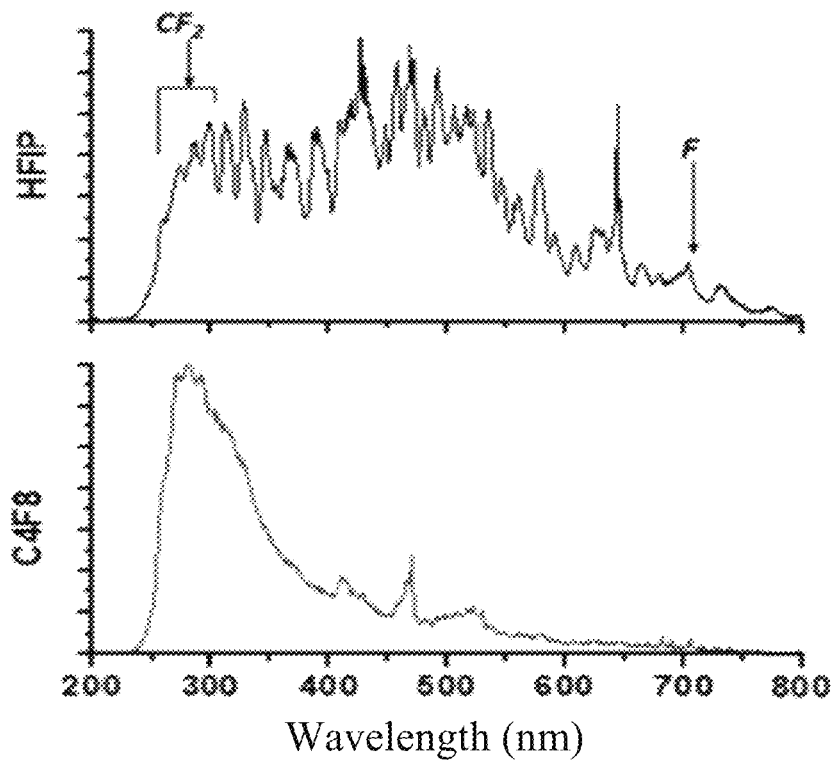
FIG. 5 is a diagram for illustrating an optical emission spectroscopy result.
Figure 5:
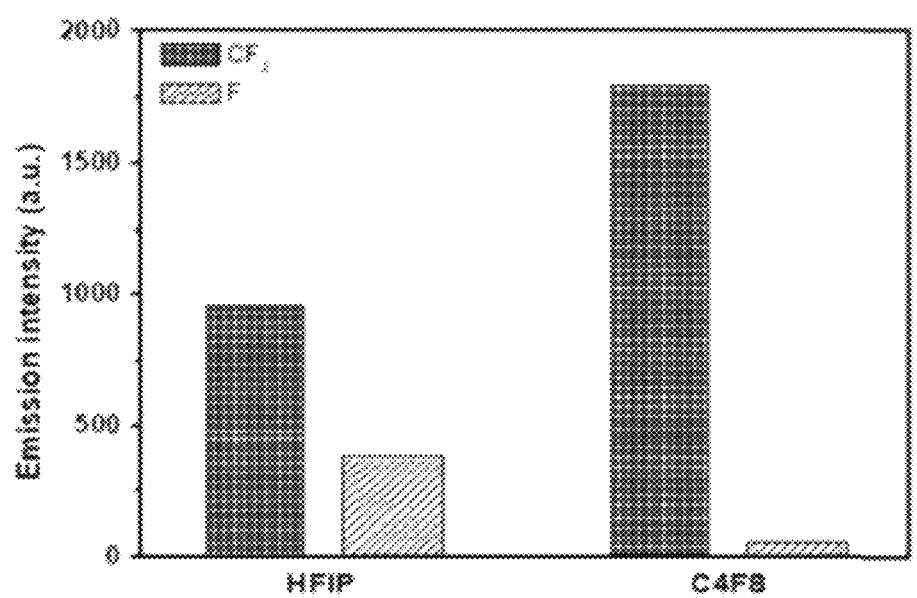

FIG. 5 is a diagram for illustrating the result of optical emission spectroscopy. In FIG. 5, (a) and (b) respectively show OES results of the HFIP/Ar based plasma according to the present disclosure and the $C_4F_8$/Ar based plasma according to the prior art.

As shown in FIG. 5, the HFIP/Ar based plasma according to the present disclosure has smaller $CF_2$ radical generation and larger F radical generation than the $C_4F_8$/Ar based plasma. The $CF_2$ radicals are a major cause of the formation of the steady state fluorocarbon thin film on the etching target surface. When the amount of $CF_2$ radicals as generated is large, this can interfere with the diffusion of reactive ions and radicals to act as an etching inhibitor. That is, as the amount of the generated $CF_2$ radicals is increased, the etching may be inhibited. The HFIP/Ar based plasma according to the present disclosure may inhibit the formation of $CF_2$ radicals due to the oxygen atoms contained in the molecules thereof. Thus, it is possible to reduce the thickness of the thin film of fluorocarbon and to exhibit a higher $SiO_2$ etching rate than that by the $C_4F_8$ plasma.

That is, it may be confirmed that the HFIP/Ar based plasma according to the present disclosure exhibits an etching characteristic superior to the conventional PFC plasma.

In one example, we check the etching rate and selectivity of the HFIP/Ar based plasma to various etching targets.

Under the conditions as in Table 2, the etching rate and selectivity of each of the $SiO_2$ thin film, $Si_3N_4$ thin film, poly-Si thin film and amorphous carbon film (ACL) based on the source voltages are investigated.

Figure 6:
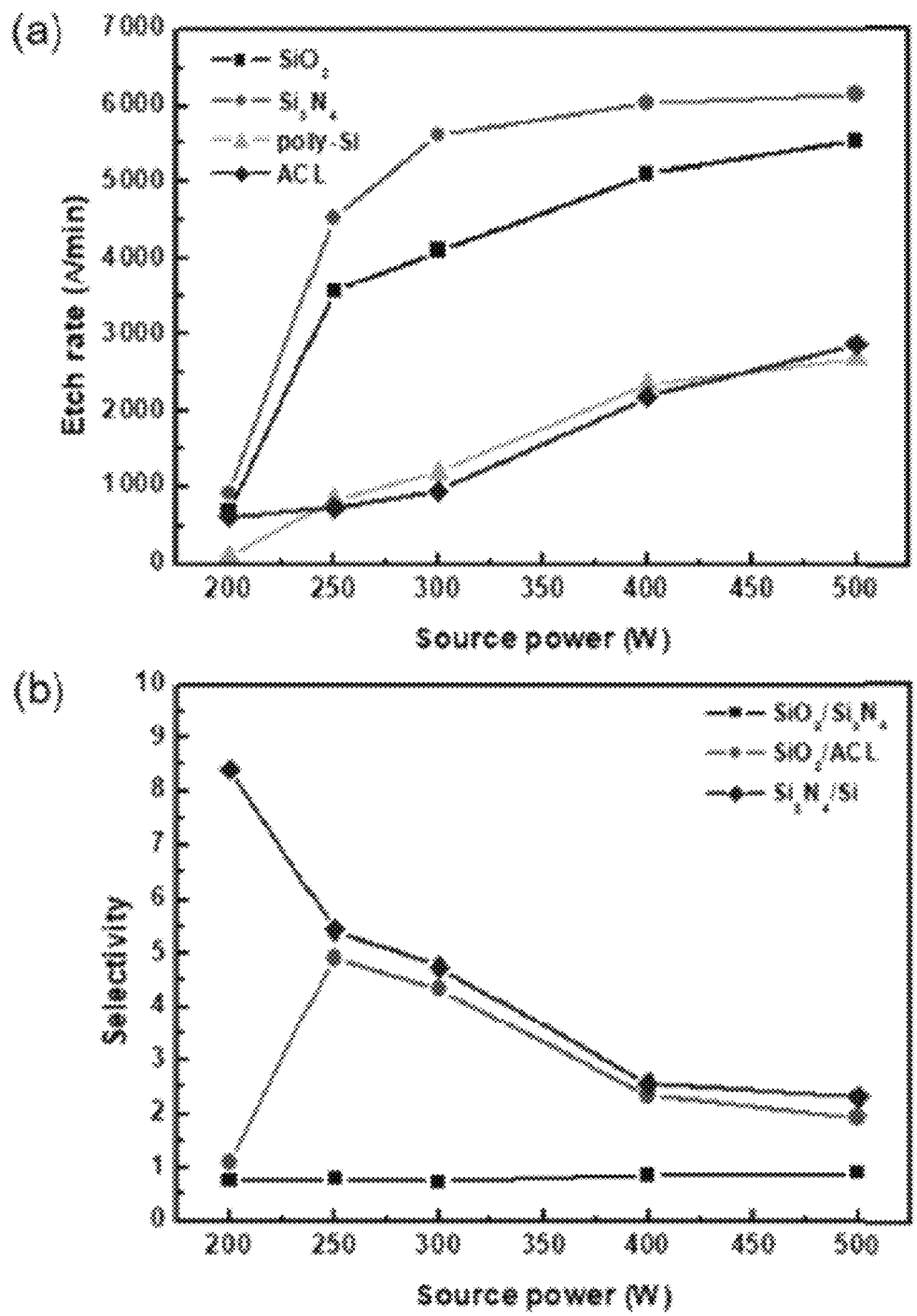
FIG. 6 is an illustration of an etching rate and selectivity of a HFIP/Ar based plasma in accordance with the present disclosure to various etching targets.

FIG. 6 is an illustration of the etching rate and selectivity of the HFIP/Ar based plasma in accordance with the present disclosure to various etching targets.

In FIG. 6, (a) shows the etching rate by the HFIP/Ar based plasma to various etching targets, and (b) shows the selectivity of the HFIP/Ar based plasma to the various etching targets.

Referring to (a) in FIG. 6, the etching rate of $Si_3N_4$ is the most dominant in all conditions. The etching rate of the poly-Si is similar to that of ACL. In particular, the etching rate increases with the increasing source power, but the variation of the etching rate of $Si_3N_4$ is not large at 400 W or greater of the source power.

Further, as shown in (b) in FIG. 6, the selectivity to the $SiO_2/Si_3N_4$ is almost constant at about 0.8 at all source power conditions. The selectivity to the $Si_3N_4$/Si decreases with increasing source power. To the contrary, the selectivity to $SiO_2$/ACL is the highest at 250 W source power.

Figure 7:
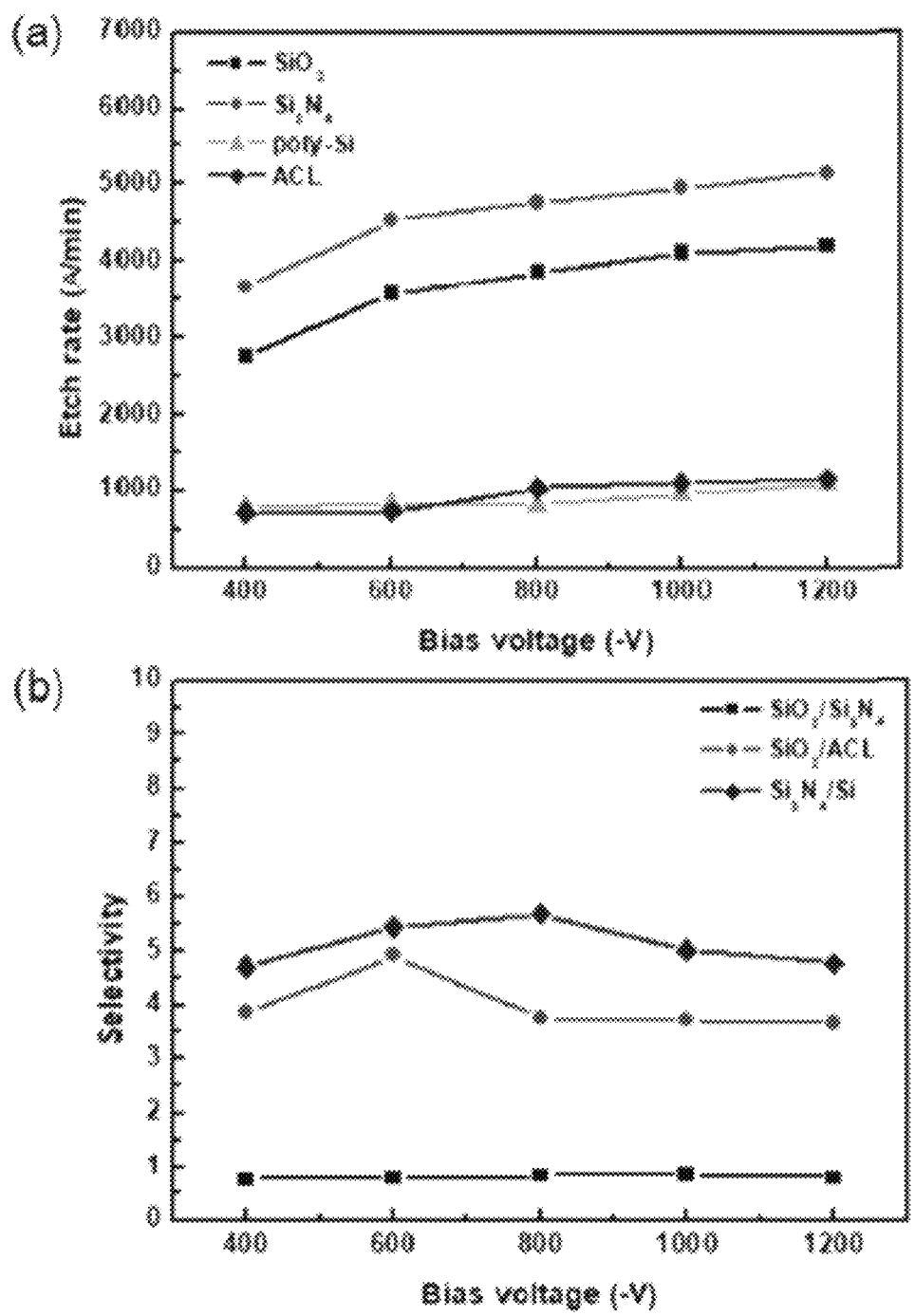
FIG. 7 is an illustration of an etching rate and selectivity of a HFIP/Ar based plasma in accordance with with the present disclosure to various etching targets.

Next, the etching rate and selectivity of each of the $SiO_2$ thin film, $Si_3N_4$ thin film, poly-Si thin film and amorphous carbon film based on the bias voltages are checked under the conditions as in Table 3 and based on the varying bias voltage. the results are shown in FIG. 7.

FIG. 7 shows the etching rate by and selectivity of the HFIP/Ar based plasma in accordance with the present disclosure to various etching targets.

In FIG. 7(a) shows the etching rate by the HFIP/Ar based plasma to various etching targets, and (b) shows the selectivity of the HFIP/Ar based plasma to various etching targets.

Referring to (a) in FIG. 7, the etching rate of the $Si_3N_4$ by the HFIP/Ar based plasma is the most dominant in all conditions. The etching rates of the poly-Si and ACL are similar to each other. In one example, it may be seen that when the bias voltage is higher than −800 V, the etching rate of the $SiO_2$ is higher than 4000 Å/min, and the etching rate of the $Si_3N_4$ is about 5000 Å/min.

Further, referring to (b) in FIG. 7, we may see that a size of the variation based on the condition is not large unlike as shown in (b) FIG. 6. This indicates that the selectivity of the HFIP/Ar based plasma is not significantly affected by the bias voltage.

Further, a high aspect ratio etched structure is fabricated using a plasma etching process according to the present disclosure.

Specifically, a hole pattern mask is formed on a specimen. The hole pattern mask has a total thickness of 1400 nm and has a stack of a 50 nm SiON thin film on a 1350 nm ACL. The hole pattern mask is formed on a 2400 nm thick $SiO_2$ thin film. The diameters of the holes defined in the hole pattern mask are 200 nm and 100 nm, respectively.

Then, the SiO2 thin film on which the hole pattern mask is disposed is plasma-etched under the conditions shown in Table 4, and the results are shown in FIGS. 8 to 11.

TABLE 4

| Source power (W) | Bias voltage (V) | Discharge Gas (X/Y) | Total Flow Rate (sccm) | Pressure (mTorr) | Substrate Temperature (° C.) | Etch Time (min) |
|---|---|---|---|---|---|---|
| 250 | −400, −800, −1200 | HFIP/Ar | 30 (X/Y = 10/20) | 10 | 15 | 12 |

FIG. 8 to FIG. 11 illustrate formations of the high aspect ratio etched structure according to the present disclosure.

Figure 8:
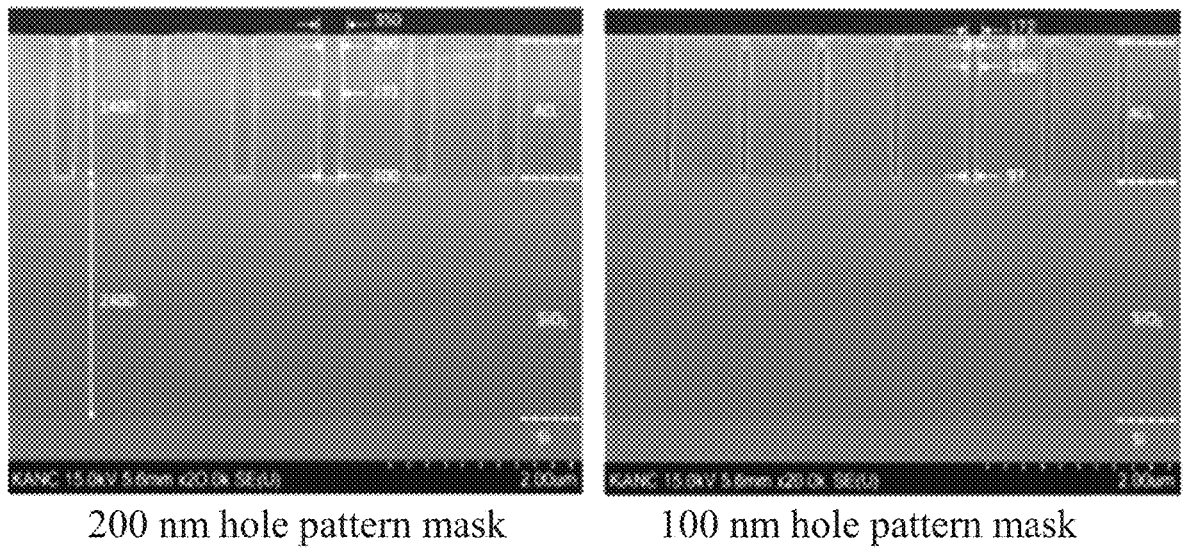
FIG. 8 to FIG. 11 illustrate formation of a high aspect ratio etched structure according to the present disclosure.
Figure 9:
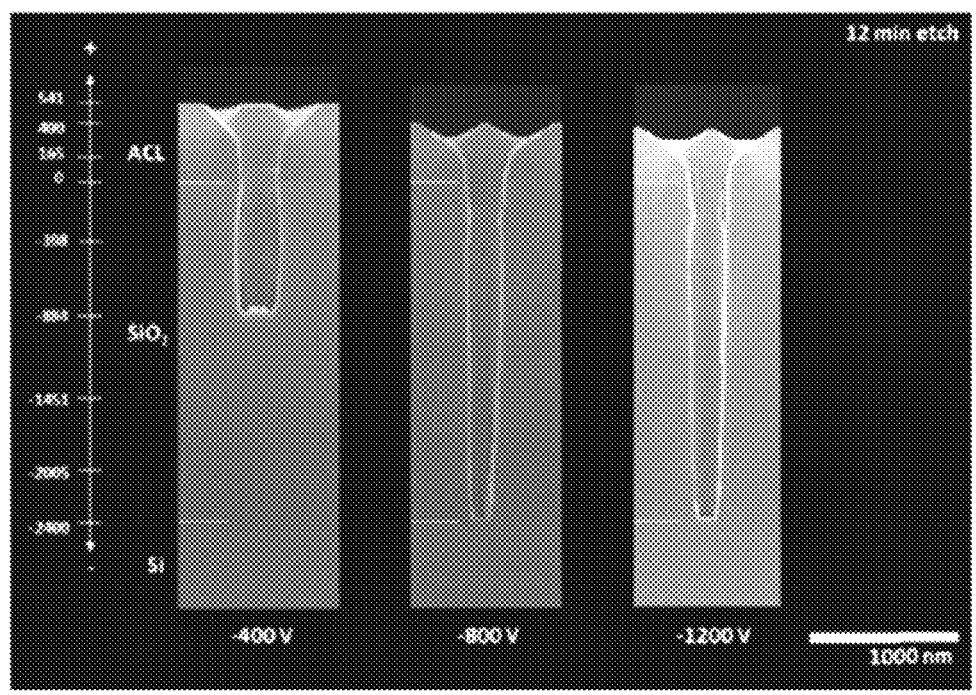
Figure 10:
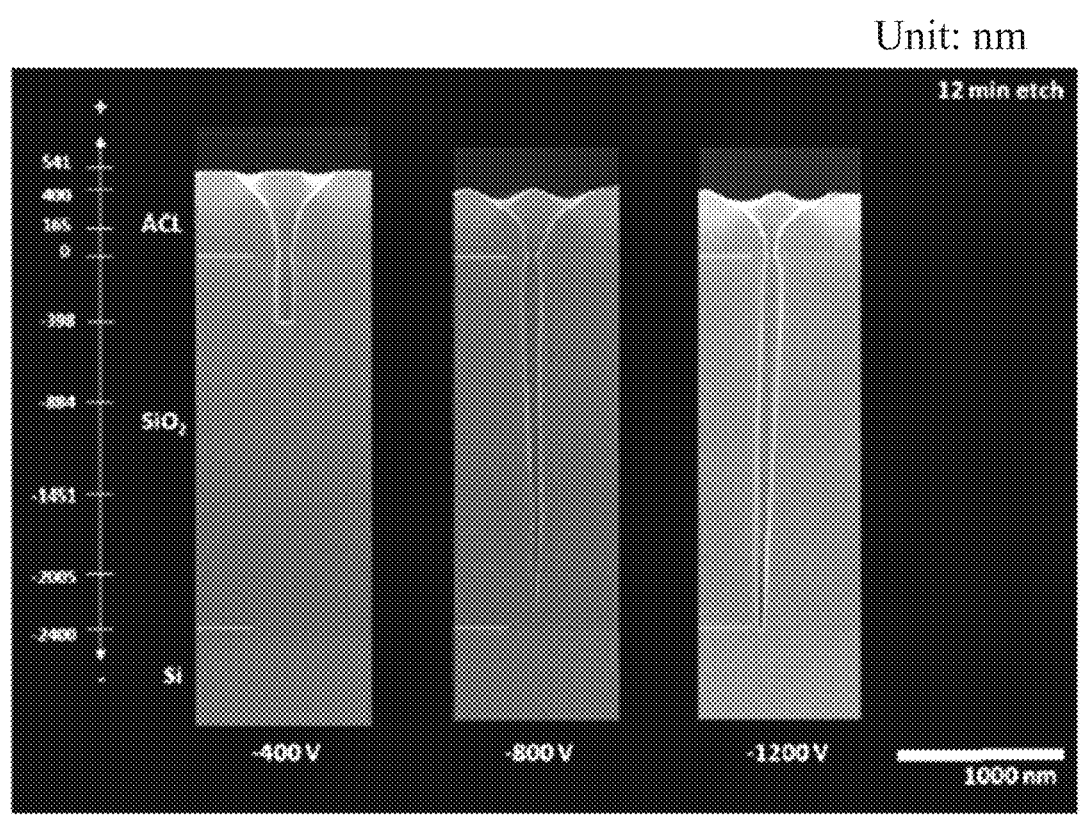
Figure 11:
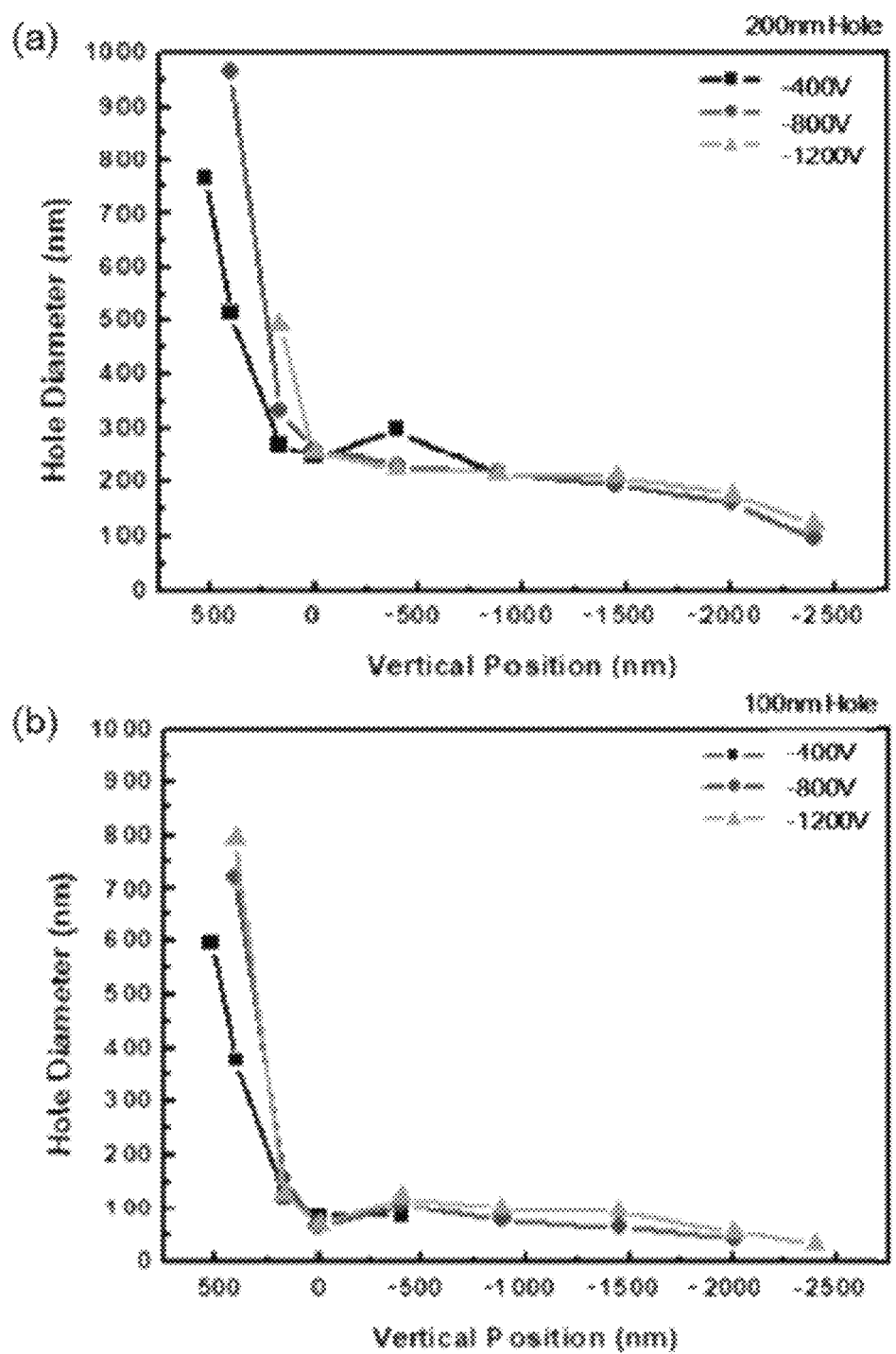

FIG. 8 shows a FE-SEM (field emission scanning electron microscope) cross-sectional photograph of a specimen on which a hole pattern mask is disposed prior to an etching process to fabricate a high aspect ratio etched structure using the HFIP/Ar based plasma according to the present disclosure. FIG. 9 and FIG. 10 respectively show FE-SEM cross-sectional photographs of the specimens on which a hole pattern mask of a hole of a diameter of 200 nm and a hole pattern mask of a hole of a diameter of 100 nm are disposed respectively after etching the specimens for 12 minutes at a bias voltage. FIG. 11 shows the variation of the diameter along the vertical level in the specimens while the hole pattern mask remains after the etching. In FIG. 11, a boundary level between the ACL mask and $SiO_2$ is set to a vertical level 0, and a bottom of a recess has a vertical level −2400 nm.

Referring to FIGS. 8 to 11, as shown in FIG. 9, when a bias voltage of −400 V is applied for etching for 12 minutes, the specimen beneath the hole pattern mask having a hole diameter of 200 nm is etched only to a depth of about 880 nm for 12 minutes. To the contrary, when a bias voltage of −800 V or −1200 is applied for etching for 12 minutes, the specimen beneath the hole pattern mask having a hole diameter of 200 nm is etched only to a depth of about 2400 nm for 12 minutes. In this connection, referring to the diameter variation graph shown in (a) in FIG. 11, as the depth of etching is increased, the diameter of the hole decreases gradually. The decrease in diameter is smaller at −1200 V than at −800 V.

As shown in FIG. 10, when a bias voltage of −400 V or −800V is applied for etching for 12 minutes, the specimen beneath the hole pattern mask having a hole diameter of 100 nm has not been etched to a depth of 2400 nm for 12 minutes. As shown in FIG. 10, when a bias voltage of −1200V is applied for etching for 12 minutes, the specimen beneath the hole pattern mask having a hole diameter of 100 nm has been etched to a depth of 2400 nm for 12 minutes. In this connection, referring to the diameter variation graph shown in (b) in FIG. 11, as the depth of etching is increased, the diameter of the hole decreases gradually.

That is, according to the present disclosure, it may be confirmed that etched structures having the aspect ratios of 12 and 24 may be fabricated by etching the specimen beneath the hole pattern masks having hole diameters of 200 nm and 100 nm via the plasma etching method using HFIP which is significantly lower in GWP than the PFC gas.

According to the plasma etching method according to the present disclosure, the etching target can be plasma-etched with excellent etching characteristics using a combination of hexafluoroisopropanol (HFIP) and argon gases with a very low global warming potential (GWP) of 190. According to the present disclosure, the plasma etching method can exhibit an etching characteristic that is at least four times higher than that of a plasma etching method using the conventional PFC gas having a high GWP at the same condition and thus can etch the etching target in an environmentally friendly manner. Thus, the present plasma etching method using the combination of hexafluoroisopropanol (HFIP) and argon gases may replace the plasma etching method using the conventional PFC gas.

Further, using the etching method according to the present disclosure may provide for a high aspect ratio etched hole structure. Accordingly, the plasma etching method according to the present disclosure may be applied to a plasma etching process in various technical fields such as a semiconductor, a display, MEMS, etc. using the conventional PFC gas such that environmentally friendly etching may be performed with excellent characteristics.

Hereinabove, although the present disclosure has been described with reference to exemplary embodiments and the accompanying drawings, the present disclosure is not limited thereto, but may be variously modified and altered by those skilled in the art to which the present disclosure pertains without departing from the spirit and scope of the present disclosure claimed in the following claims.

What is claimed is:

1. A plasma etching method comprising supplying both hexafluoroisopropanol (HFIP) gas and argon (Ar) gas to a plasma chamber receiving an etching target therein, thereby to plasma-etch the etching target,
    wherein the plasma chamber is connected to a canister containing hexafluoroisopropanol (HFIP) in a liquid phase by a chamber connecting line, and is connected to an argon gas injection line different from the chamber connecting line, and
    wherein the supplying comprises:
    generating the HFIP gas by heating the canister at a first temperature higher than a boiling point of the HFIP and heating the chamber connecting line at a second temperature higher than the first temperature, and
    supplying the generated HFIP gas to the plasma chamber through the chamber connecting line and supplying the argon gas to the plasma chamber through the argon gas injection line,
    wherein the Ar gas is supplied to the plasma chamber at a flow rate being in a range of 67% to 80% of a total flow rate of the Ar gas and the HFIP gas.

2. The plasma etching method of claim 1, wherein the etching target includes at least one of oxide of silicon and nitride of silicon.

3. The plasma etching method of claim 1, wherein the etching target includes at least one of oxide of silicon and nitride of silicon, wherein a hole pattern mask is disposed on the etching target.

* * * * *